United States Patent [19]
Ryu et al.

[11] Patent Number: 5,908,672
[45] Date of Patent: Jun. 1, 1999

[54] METHOD AND APPARATUS FOR DEPOSITING A PLANARIZED PASSIVATION LAYER

[75] Inventors: Choon Kun Ryu, Sunnyvale; Judy H. Huang, Los Gatos; David Cheung, Foster City, all of Calif.

[73] Assignee: Applied Materials, Inc., Santa Clara, Calif.

[21] Appl. No.: 08/950,923

[22] Filed: Oct. 15, 1997

[51] Int. Cl.[6] .................................................. C23C 16/40
[52] U.S. Cl. ...................... 427/574; 427/579; 427/255.2; 427/255.3; 427/255.7; 438/624; 438/763; 438/784; 438/958
[58] Field of Search ................................ 427/255, 255.2, 427/255.3, 255.7, 574, 579; 438/624, 763, 784, 958

[56] References Cited

U.S. PATENT DOCUMENTS

| | | | |
|---|---|---|---|
| 4,545,852 | 10/1985 | Barton | 156/643 |
| 5,288,518 | 2/1994 | Homma | 427/255.1 |
| 5,314,845 | 5/1994 | Lee et al. | 427/255.3 |
| 5,356,722 | 10/1994 | Nguyen et al. | 427/569 |
| 5,429,995 | 7/1995 | Nishiyama et al. | 427/579 |
| 5,571,571 | 11/1996 | Musaka et al. | 427/574 |
| 5,571,578 | 11/1996 | Kaji et al. | 427/579 |
| 5,703,404 | 12/1997 | Matsuura | 257/758 |

FOREIGN PATENT DOCUMENTS

| | | |
|---|---|---|
| 0 633 605 | 1/1995 | European Pat. Off. . |
| 0 724 286 | 7/1996 | European Pat. Off. . |
| 0 761 841 | 3/1997 | European Pat. Off. . |
| 60-27485 | 2/1994 | Japan . |
| 8-218170 | 8/1996 | Japan . |

OTHER PUBLICATIONS

Pierson, Handbook of Chemical Vapor Deposition, Noyes Publications, Park Ridge, New Jersey, pp. 222–224. (no month), 1992.

Swope et al., J. Electrochem. Soc., vol. 144, No. 7, pp. 2559–2564, Jul. 1997.

Suzuki Mieko et al., "A Fully Planarized Multilevel Interconnection Technology Using Selective TEOS–Ozone APCVD," *Proceedings of IEEE International Electron Devices Meeting*, Dec. 13–16, 1992, San Francisco, California, pp. 293–296.

Treichel H. et al., "New Dielectric Materials and Insulators for Microelectronic Applications," *Ceramics International*, 1996, vol. 22, pp. 435–442. (No Month).

Yu Byoung–Gon et al., "Characteristics of SiOF Films Formed by Remote Plasma Enhanced Chemical Vapor Deposition with $SF_6$ Gas," *Jpn. J. Appl. Phys.*, vol. 35, Part 2, Nu. 6B, Jun. 15, 1996, pp. L745–747.

*Primary Examiner*—Shrive Beck
*Assistant Examiner*—Timothy Meeks
*Attorney, Agent, or Firm*—Townsend & Townsend & Crew

[57] ABSTRACT

A planarized passivation layer is described. A planarized passivation layer of the present invention preferably includes a fluorosilicate glass (FSG) layer and a silicon nitride layer. The FSG layer is preferably deposited using triethoxyfluorosilane (TEFS) and tetraethoxyorthosilicate (TEOS). The inclusion of fluorine in the process chemistry provides good gap-fill characteristics in the film thus formed. The TEFS-based process employed by the present invention employs a low deposition rate, on the order of less than about 4500 Å/min, and preferably above 3000 Å/min, when depositing the FSG layer. The use of low deposition rate results in a positively sloped profile, preventing the formation of voids during the deposition of the FSG layer and the silicon nitride layer.

21 Claims, 11 Drawing Sheets

METHOD AND APPARATUS FOR DEPOSITING A PLANARIZED PASSIVATION LAYER

BACKGROUND OF THE INVENTION

The present invention relates to substrate processing. More specifically, the present invention relates to the deposition of a planarized passivation layer.

Interconnections of semiconductor devices on integrated circuits are typically made by metal conductors, which in some cases are narrow, closely spaced metal lines. The use of two (or more) levels of such metal conductors is not uncommon. After the last layer of metal conductor is deposited, one of the final fabrication steps is the deposition of an insulating layer, also referred to as a passivation layer. The passivation layer protects the underlying layers from chemical action, corrosion, and/or mishandling during the packaging process by protecting the device from moisture, contamination, and physical contact. Several techniques are currently used to apply passivation layers.

One technique used to create passivation layers employs spin-on glass (SOG). The most commonly used SOG materials are $SiO_x$-based polysiloxanes. SOG films are typically applied to a predeposited oxide as a liquid that covers a substrate's features. As with photoresist, the material is dispensed on a wafer and spun with a rotational speed that determines the SOG thickness. The film is then cured and, optionally, etched back to smooth the surface. The SOG may be capped to protect it during further processing. However, silicon oxide-based SOG can have detrimental effects on circuits, most of them related to its absorption of water. The presence of water in SOG can create problems such as mobile protons and large increases in the dielectric constant, resulting in an increase in parasitic capacitance and performance degradation.

A more common method of forming a passivation layer is by the chemical reaction of gases. Such a deposition process is referred to as chemical vapor deposition or CVD. Conventional thermal CVD processes supply reactive gases to the substrate surface where heat-induced chemical reactions produce a desired film. Another CVD technique is plasma-enhanced CVD (PECVD). PECVD techniques promote excitation and/or dissociation of the reactant gases by the application of energy, such as radio frequency (RF) energy, to excite the reactant gases, thereby creating a plasma. The high reactivity of the species in the plasma reduces the energy required for a chemical reaction to take place. This lowers the process's operating temperature, making the PECVD process well-suited to depositing insulating layers over deposited metal layers (e.g., passivation layers).

PECVD processes used to deposit passivation layers often employ some type of glass material. For example, a PECVD technique may be used to deposit a passivation layer of silicon nitride ($Si_3N_4$) or undoped silicate glass (USG). Optionally, dopants may be included to improve step coverage, dielectric constant, and other film characteristics. Such doped passivation layers include the use of materials such as phosphosilicate glass (PSG). One common planarization technique is the fabrication of a multilevel passivation layer. The structure is formed, for example, by depositing a silicon oxide layer, followed by a silicon nitride layer. To maintain high throughput, such processes use deposition rates of 4800 Å/min or more. However, the gap-fill capabilities of such films may be insufficient for use in some circumstances.

As device sizes have become smaller and integration density has increased, issues that were not previously considered important by the industry have become of concern. For example, as circuit densities increase, the spacing between adjacent metal conductors decreases, which causes an increase in the ratio of the height of adjacent conductors to their separation, commonly referred to as the aspect ratio. An increase in the aspect ratio is accompanied by an increase in the likelihood that a deposited insulating layer will not conform to and completely fill the gap between conductors. Thus, as an insulating layer is deposited, an undesirable void may form within the layer between adjacent conductors. Typically, voids are formed when the dielectric deposits on the upper portion of adjacent metal vertical side walls contact each other before the bottom of the gap is filled. These voids may trap air, or, if photolithographic patterning is subsequently performed (e.g., to form contact pads), they may trap the photoresist material used to transfer the pattern onto the passivation layer. The trapped photoresist may then be outgassed during subsequent heating of the substrate. Moreover, such voids can create (and propagate) cracks in the various layers.

A solution to the gap-fill problem is to perform a three-step deposition/etch-back/deposition (DED) process. In this three-step process, an insulating layer is first partially deposited over a metal layer. Next, a physical etch-back step is performed in which the deposited insulation layer is bombarded with argon or a similar gas in a sputtering step. The argon sputtering etches away some of the excess deposits that might otherwise contribute to void formation. After completion of the physical etch-back, deposition is completed in the third step. The three-step deposition/etch-back/deposition process provides improved gap-fill capabilities that are suitable for many applications, including the formation of passivation layers.

However, the DED process is a slow, complex operation in comparison with the SOG and PECVD methods described previously. This complexity adds to the cost of devices thus fabricated (due to the increase in processing needed to produce the device), reduces throughput, and increases the probability of equipment failure. Moreover, as devices become even smaller, better gap-fill capabilities are likely to be desirable for some applications. Hence, there is a need for a method and an apparatus that further improve the gap-fill capability and planarity of present passivation layers. Preferably, these techniques should operate in a fast, simple, and cost-effective manner.

SUMMARY OF THE INVENTION

The present invention provides a method and apparatus for use in the processing of substrates. More specifically, the present invention relates to the deposition of a planarized passivation layer. The method and apparatus of the present invention provide a fast, simple, and cost-effective technique for depositing a passivation layer having good gap-filling capabilities and film characteristics.

According to one aspect of the invention, a process for depositing a passivation layer over a substrate disposed in a processing chamber is described. The process begins by depositing a first layer of the passivation layer over a metal layer deposited over the substrate using a first process gas that includes silicon, oxygen, and a halogen element, the first layer being deposited at a deposition rate of less than about 4500 Å/min. It is also preferable, though not mandatory, that the deposition rate be kept above 3000 Å/min to maintain throughput. Next, a second layer of the passivation layer is deposited over the first layer to protect the first layer (and the structures below) from physical damage. Because the first layer is subject to water absorption and dopant outgassing when exposed to an ambient (e.g., a clean room's atmosphere), the second layer also serves to protect the first layer in situations where it would otherwise be exposed to that ambient. The first layer of the passivation layer is a fluorine-doped silicon oxide (fluorosilicate glass, or FSG) layer, which is preferably deposited using a first process gas including triethoxyfluorosilane (TEFS), tetraethoxyorthosilicate (TEOS), and oxygen. Optionally, the first process gas may further include helium as a carrier gas. The second layer may be, for example, a silicon nitride layer.

By depositing the first layer at a rate of less than about 4500 Å/min, the present invention prevents the formation of voids in the passivation layer. This is because the low deposition rate causes the first layer's profile, when deposited in gaps, to have a positive slope (i.e., to slope away from the gap's centerline, when proceeding from the gap's bottom to its top). Thus, not only does the low deposition rate of the present invention prevent gap formation in the first layer, it also prevents gap formation in the subsequently deposited second layer. However, because maintenance of system throughput is also a priority, the deposition rate is preferably maintained above about 3000 Å/min.

These and other embodiments of the present invention, as well as its advantages and features are described in more detail in conjunction with the text below and attached figures.

DETAILED DESCRIPTION OF THE INVENTION

I. Introduction

A planarized passivation layer of the present invention preferably includes a fluorosilicate glass (FSG) layer and a silicon nitride layer. The FSG layer is preferably deposited using triethoxyfluorosilane (TEFS) and tetraethoxyorthosilicate (TEOS). The inclusion of fluorine in the process chemistry provides good gap-fill characteristics in the film thus formed. The TEFS-based process employed by the present invention employs a low deposition rate, on the order of less than about 4500 Å/min and preferably about 4000 Å/min, when depositing the FSG layer. The use of low deposition rate results in a positively sloped profile, preventing the formation of voids during the deposition of the FSG layer and the silicon nitride layer.

II. Exemplary CVD System

Figure 1A:
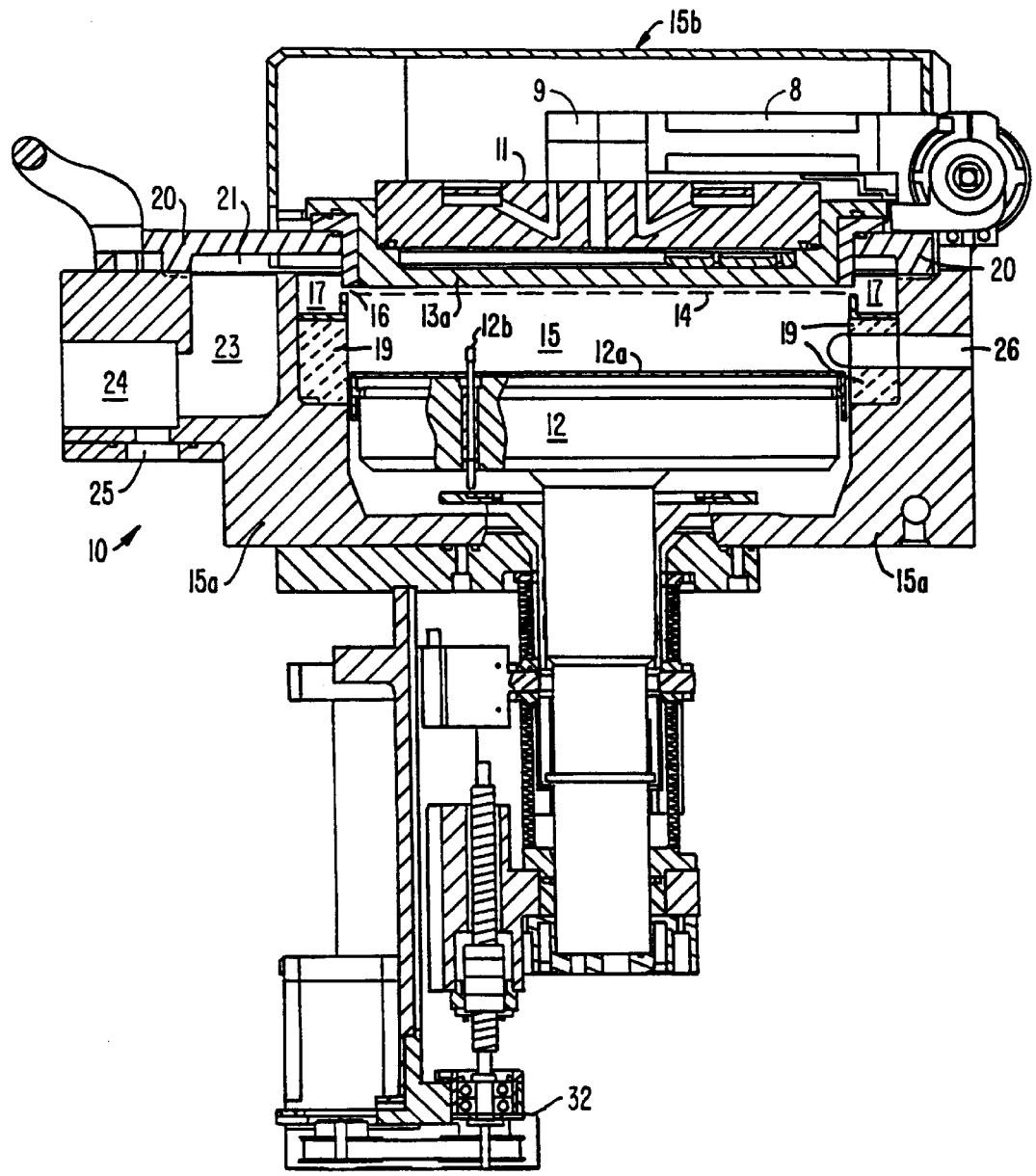
FIGS. 1A and 1B are vertical, cross-sectional views of one embodiment of an exemplary substrate processing system that may be used in accordance with the present invention.
Figure 1B:
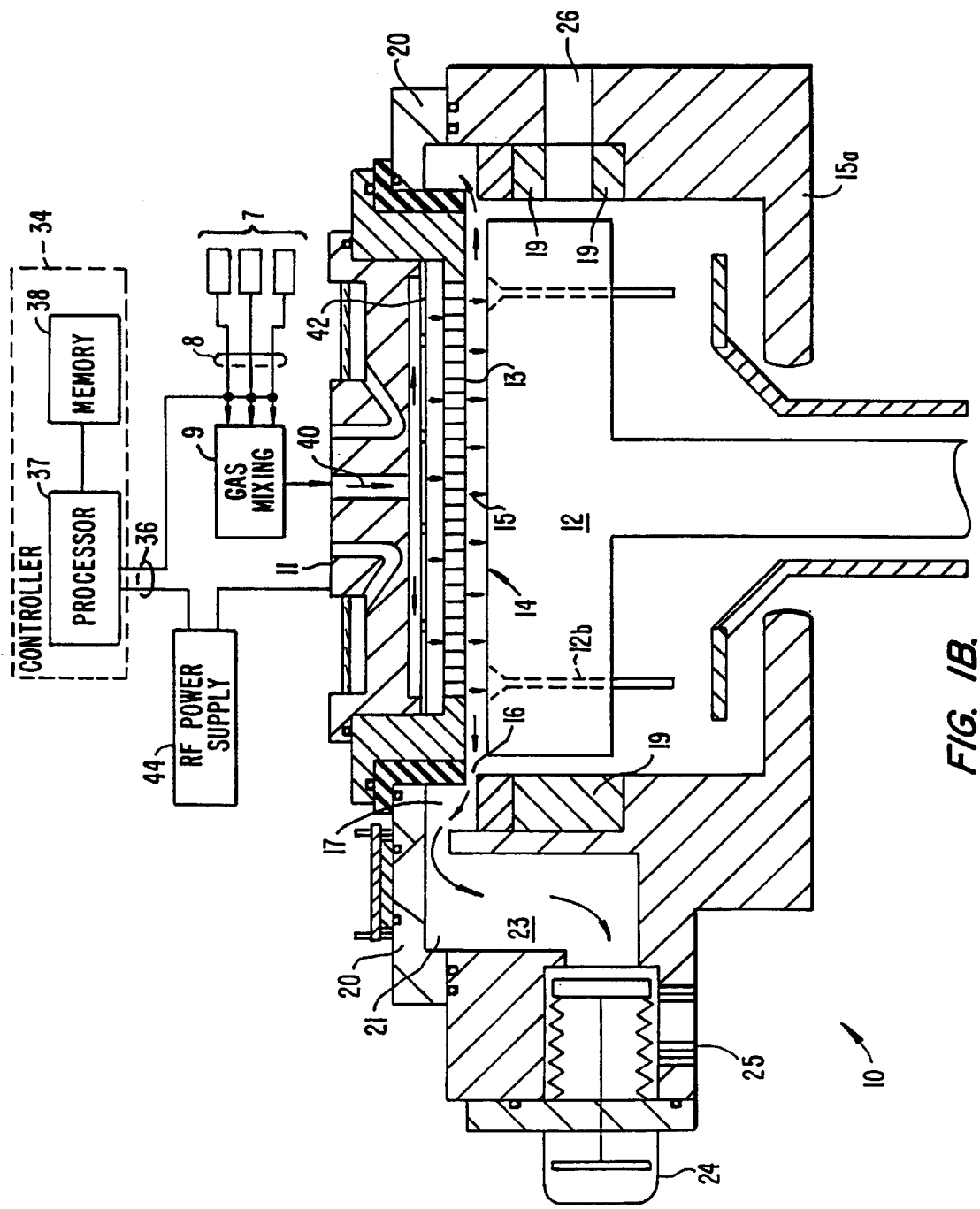
Figure 1C:
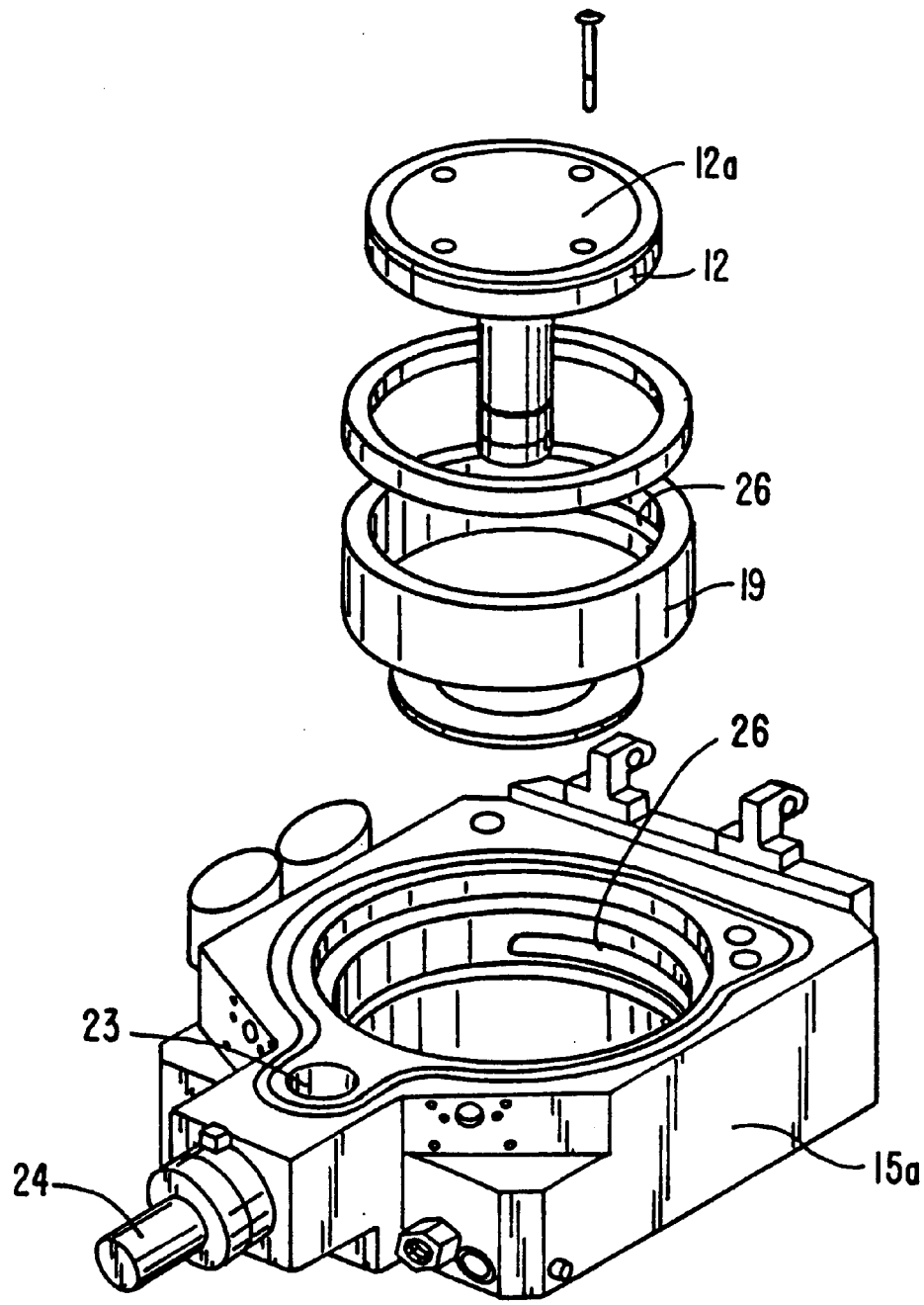
FIGS. 1C and 1D are exploded perspective views of parts of the CVD system depicted in FIG. 1A.
Figure 1D:
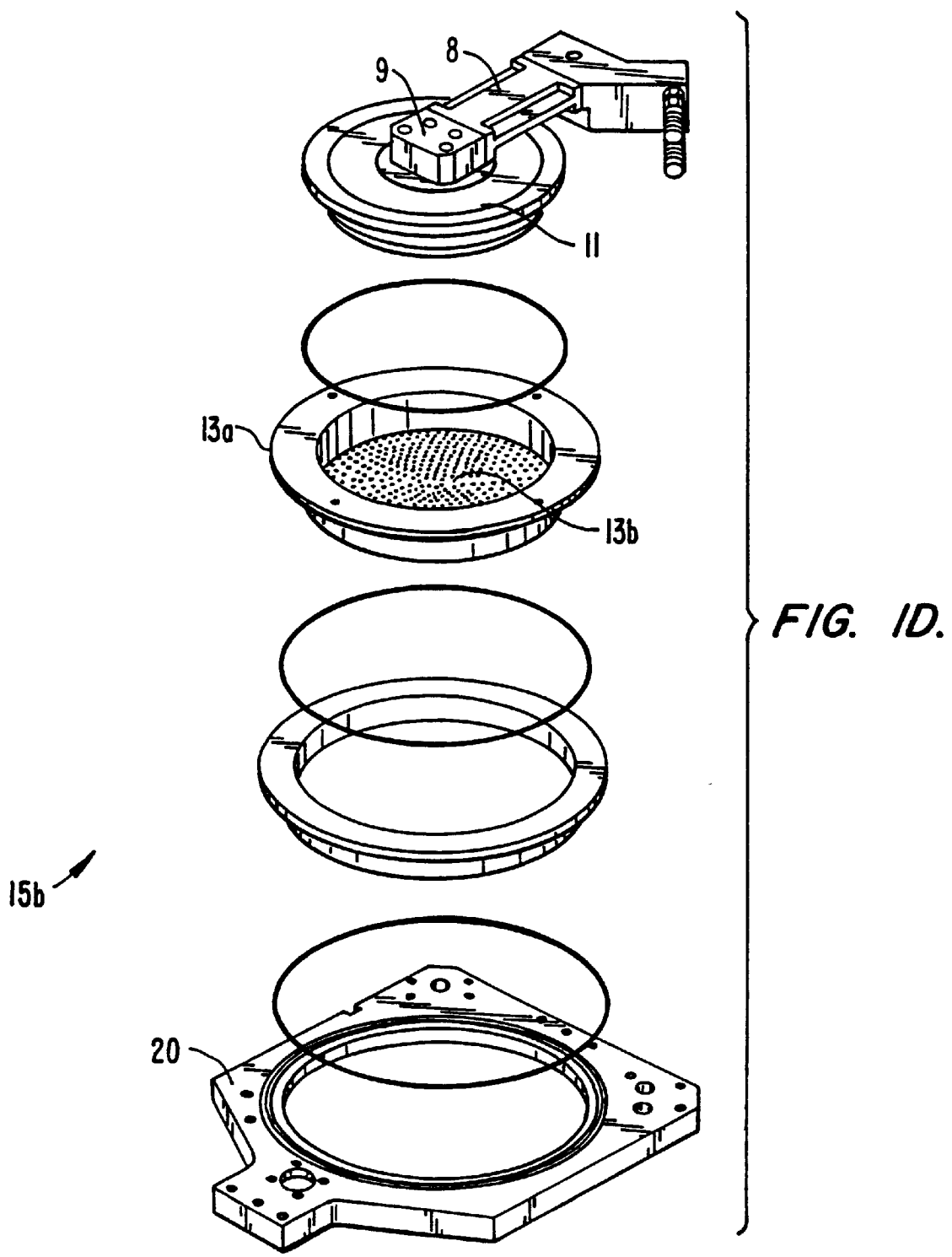

Specific embodiments of the present invention may be deposited using a variety of chemical vapor deposition (CVD) or other types of substrate processing systems. One suitable substrate processing system in which the method of the present invention may be practiced is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

CVD system 10 contains a gas distribution manifold 11 for dispersing process gases to a substrate (not shown) that rests on a resistively heated pedestal 12 centered within the process chamber. The volume between gas distribution manifold 11 and pedestal 12 is referred to herein as a deposition zone. A portion of this volume may also be referred to in this manner. During processing, the substrate (e.g., a semiconductor substrate) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the substrates. Deposition and carrier gases flow into chamber 15 through perforated holes 13b (FIG. 1D) of a conventional flat, circular gas distribution face plate 13a. More specifically, deposition process gases flow (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11, bypassing gas mixing system 9. In other situations, any of gas lines 8 may bypass gas mixing system 9 and introduce gases through passages (not shown) in the bottom of chamber 12.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. Constituents of the plasma react to deposit a desired film on the surface of the semiconductor substrate supported on pedestal 12. RF power supply 44 can be a mixed-frequency RF power supply that typically supplies power at a high RF frequency (RF1) of 13.56 MHz and at a low RF frequency (RF2) of 360 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture reacts thermally to deposit the desired film on the surface of the semiconductor substrate supported on pedestal 12, which is resistively heated to provide the thermal energy needed for the reaction.

During a thermal deposition process, pedestal 12 is heated, causing heating of CVD system 10. In a hot-wall system, of the type previously mentioned, a hot liquid may be circulated through chamber wall 15a to maintain chamber wall 15a at an elevated temperature when the plasma is not turned on, or during a thermal deposition process. Fluids used to heat chamber wall 15a include the typical fluid types (i.e., water-based ethylene glycol or oil-based thermal transfer fluids). This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow. In a cold-wall system, chamber wall 15a is not heated. This might be done, for example, during a plasma-enhanced deposition process. In such a process, the plasma heats chamber 15, including chamber wall 15a surrounding exhaust passageway 23 and shut-off valve 24. However, because the plasma is unlikely to be in equal proximity to all chamber surfaces, variations in surface temperature may occur, as previously noted.

The remainder of the gas mixture that is not deposited in a layer, including reaction products, is evacuated from the chamber by a vacuum pump (not shown). Specifically, the gases are exhausted through an annular slot 16 surrounding the reaction region and into an annular exhaust plenum 17. Annular slot 16 and plenum 17 are defined by the gap between the top of chamber wall 15a (including upper dielectric lining 19) and the bottom of circular chamber lid 20. The 360° circular symmetry and uniformity of annular slot 16 and plenum 17 are important to achieving a uniform flow of process gases over the substrate so as to deposit a uniform film on the substrate. The gases flow underneath a lateral extension portion 21 of exhaust plenum 17, past a viewing port (not shown), through a downward-extending gas passage 23, past a vacuum shut-off valve 24 (whose body is integrated with a lower portion of chamber wall 15a), and into an exhaust outlet 25 that connects to the external vacuum pump through a foreline (not shown).

The substrate support platter of resistively heated pedestal 12 is heated using an embedded, single-loop heater element configured to make two full turns in the form of concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other processing chamber hardware are made out of material such as aluminum, anodized aluminum, or a ceramic material. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers pedestal 12 and its substrate lift pins 12b as substrates are transferred by a robot blade (not shown) into and out of the body of the chamber through an insertion/removal opening 26 in the side of chamber 10. Motor 32 raises and lowers pedestal 12 between a processing position 14 and a lower substrate-loading position. Motor 32, various valves and MFCs of the gas delivery system, and other components of CVD system 10 are controlled by a system controller 34 (FIG. 1B) over control lines 36, of which only some are shown. Controller 34 relies on feedback from optical sensors to determine the position of movable mechanical assemblies, such as the throttle valve and pedestal that are moved by appropriate motors controlled by controller 34.

In a preferred embodiment, system controller 34 includes a hard disk drive (a memory 38), a floppy disk drive (not shown), and a processor 37. Processor 37 contains a single-board computer (SBC), analog and digital input/output boards, interface boards, and stepper motor controller boards. Various parts of CVD system 10 conform to the Versa Modular European (VME) standard that defines board, card cage, and connector dimensions and types. The VME standard also defines the bus structure as having a 16-bit data bus and a 24-bit address bus.

System controller 34 controls all of the activities of CVD system 10. System controller 34 executes system control software, which is a computer program stored in a computer-readable medium such as memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, the floppy disk or other another appropriate drive, may also be used to operate system controller 34.

Figure 1E:
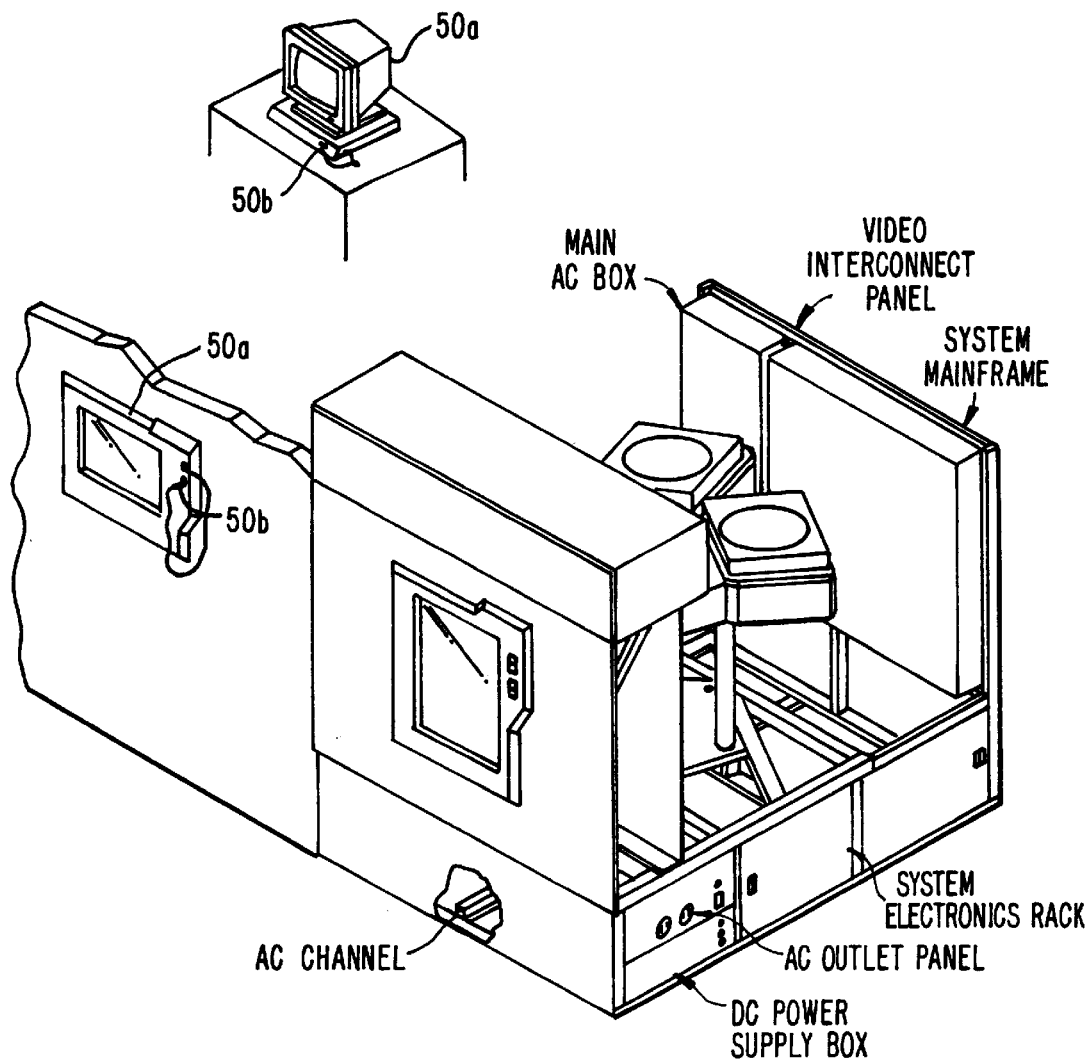
FIG. 1E is a simplified diagram of a system monitor and a CVD system in a system that may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment, two CRT monitors 50a are used, one mounted in the clean room wall for the operators and the other behind the wall for the service technicians. CRT monitors 50a simultaneously display the same information, but only one light pen 50b is enabled. A light sensor in the tip of light pen 50b detects light emitted by CRT monitor 50a. To select a particular screen or function, the operator touches a designated area of the display screen and pushes the button on pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with system controller 34.

The process for depositing the film can be implemented using a computer program product that is executed by system controller 34. The computer program code can be written in any conventional computer-readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows library routines. To execute the linked, compiled object code, the system user invokes the object code, causing the computer system to load the code in memory. The CPU then reads and executes the code to perform the tasks identified in the program.

Figure 1F:
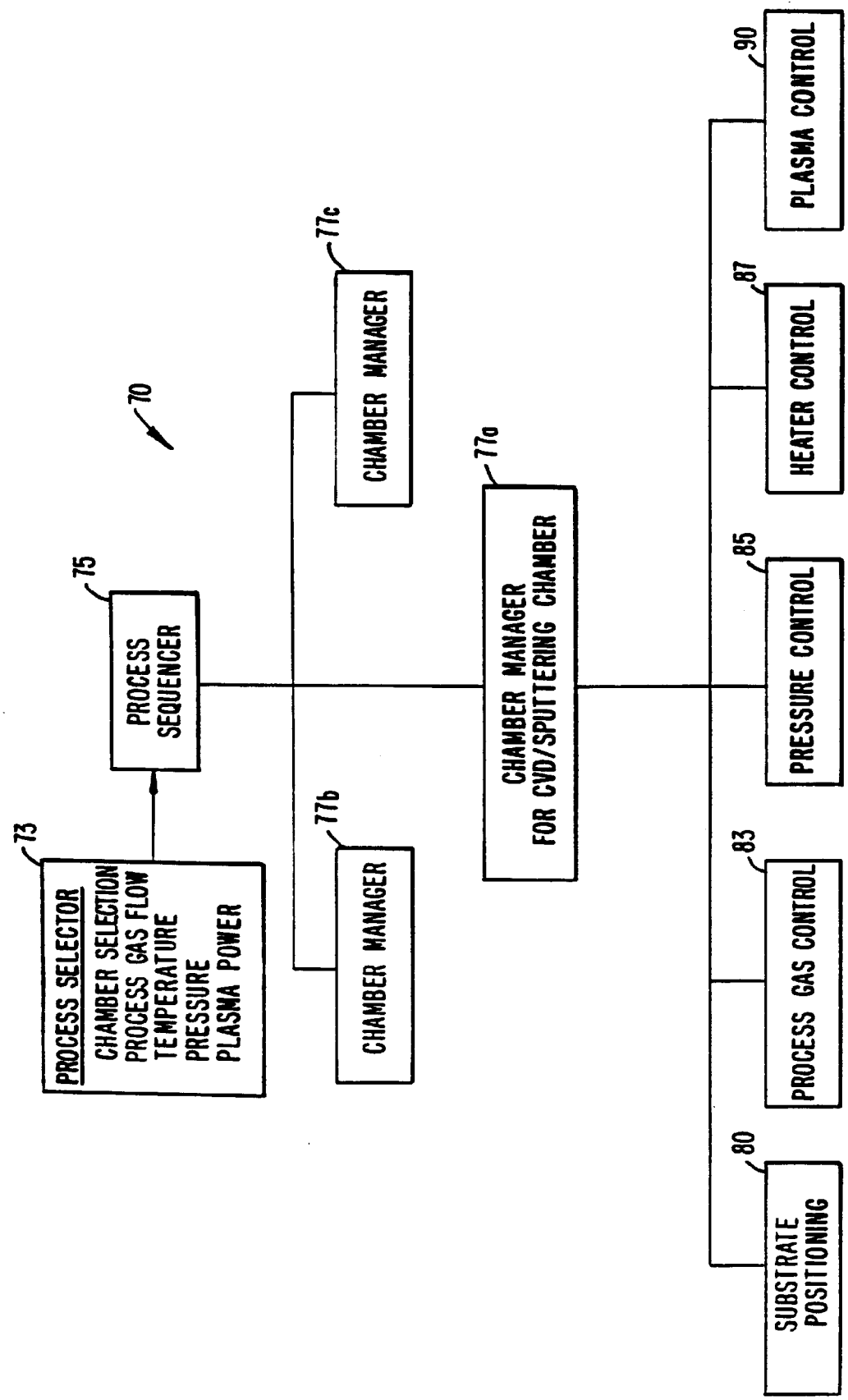
FIG. 1F shows an illustrative block diagram of the hierarchical control structure of the system control software according to a specific embodiment.

FIG. 1F is an illustrative block diagram of the hierarchical control structure of the system control software, a computer program 70, according to a specific embodiment. Using the light pen interface, a user enters a process set number and process chamber number into a process selector subroutine 73 in response to menus or screens displayed on CRT monitor 50a. The process sets are predetermined sets of process parameters necessary to carry out specified processes, and are identified by predefined set numbers. Process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low-frequency RF frequency, cooling gas pressure, and chamber wall temperature. These parameters are provided to the user in the form of a recipe and are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from process selector subroutine 73 and for controlling operation of the various process chambers. Multiple users can enter process set numbers and process chamber numbers, or a user can enter multiple process set numbers and process chamber number, so process sequencer subroutine 75 operates to schedule the selected processes in the desired sequence. Preferably, process sequencer subroutine 75 includes code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, process sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once it determines which process chamber and process set combination is to be executed, process sequencer subroutine 75 initiates execution of the process set by passing the particular process set parameters to chamber manager subroutines 77a–c, which control multiple processing tasks in process chamber 15 according to the process set determined by process sequencer subroutine 75. For example, chamber manager subroutine 77a comprises program code for controlling sputtering and CVD process operations in process chamber 15. Chamber manager subroutines 77a–c also control execution of various chamber component subroutines that control operation of the chamber components necessary to carry out the selected process set. Examples of chamber component subroutines are a substrate positioning subroutine 80, a process gas control subroutine 83, a pressure control subroutine 85, a heater control subroutine 87, and a plasma control subroutine 90. Those having ordinary skill in the art will readily recognize that other chamber control subroutines can be included depending on what processes are to be performed in process chamber 15.

In operation, chamber manager subroutine 77a selectively schedules or calls the process component subroutines in accordance with the particular process set being executed. Chamber manager subroutine 77a schedules the process component subroutines much like process sequencer subroutine 75 schedules the process set to be executed and the chamber in which to execute it. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. Substrate positioning subroutine 80 comprises program code for controlling chamber components that are used to load the substrate onto pedestal 12, to lift the substrate to a desired height in process chamber 15, and to control the spacing between the substrate and gas distribution manifold 11. When a substrate is loaded into process chamber 15, pedestal 12 is lowered to receive the substrate, and thereafter, pedestal 12 is raised to the desired height in process chamber 15, to maintain the substrate at a desired distance or spacing from gas distribution manifold 11 during processing. In operation, substrate positioning subroutine 80 controls movement of pedestal 12 in response to process set parameters, related to the support height, that are transferred from chamber manager subroutine 77a.

Process gas control subroutine 83 has program code for controlling process gas composition and flow rates. Process gas control subroutine 83 controls the open/close position of the safety shut-off valves, and also ramps up/down the mass flow controllers to obtain the desired gas flow rate. Process gas control subroutine 83 is invoked by chamber manager subroutine 77a, as are all chamber component subroutines, and receives from the chamber manager subroutine process parameters related to the desired gas flow rates. Typically, process gas control subroutine 83 operates by opening the gas supply lines and repeatedly (i) reading the necessary mass flow controllers, (ii) comparing the readings with the desired flow rates received from chamber manager subroutine 77a, and (iii) adjusting the flow rates of the gas supply lines as necessary. Furthermore, process gas control subroutine 83 includes steps for monitoring the gas flow rates for unsafe rates and for activating the safety shut-off valves when an unsafe condition is detected.

In some processes, an inert gas such as helium or argon is flowed into process chamber 15 to stabilize the pressure in the chamber before reactive process gases are introduced. For these processes, process gas control subroutine 83 is programmed to include steps for flowing the inert gas into chamber 15 for an amount of time necessary to stabilize the pressure in chamber 15, and then the above-described steps performed. Additionally, if a process gas is to be vaporized from a liquid precursor (e.g., TEOS), process gas control subroutine 83 is written to include steps for bubbling a delivery gas, such as helium, through the liquid precursor in a bubbler assembly or introducing a carrier gas, such as helium or nitrogen, into a liquid injection system. When a bubbler is used for this type of process, process gas control subroutine 83 regulates the flow of the delivery gas, the pressure in the bubbler, and the bubbler temperature in order to obtain the desired process gas flow rates. As discussed above, the desired process gas flow rates are transferred to process gas control subroutine 83 as process parameters. Furthermore, process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure, and bubbler temperature are monitored, compared with the necessary values and adjusted accordingly.

Pressure control subroutine 85 comprises program code for controlling the pressure in processing chamber 15 by regulating the size of the opening of the throttle valve in the chamber's exhaust system. The size of the throttle valve's opening is set to control the chamber pressure to the desired level in relation to the total process gas flow, size of process chamber 15, and pumping set-point pressure for the exhaust system. When pressure control subroutine 85 is invoked, the target pressure level is received as a parameter from chamber manager subroutine 77a. Pressure control subroutine 85 operates to measure the pressure in processing chamber 15 by reading one or more conventional pressure manometers connected to the chamber, to compare the measured value(s) with the target pressure, to obtain PID (proportional, integral, and differential) values from a stored pressure table corresponding to the target pressure, and to adjust the throttle valve according to the PID values obtained from the pressure table. Alternatively, pressure control subroutine 85 can be written to open or close the throttle valve to a particular opening size to regulate processing chamber 15 to the desired pressure.

Heater control subroutine 87 comprises program code for controlling the current to a heating unit that is used to heat the substrate. Heater control subroutine 87 is also invoked by chamber manager subroutine 77a and receives a target, or set-point, temperature parameter. Heater control subroutine 87 measures temperature by measuring voltage output of a thermocouple located in pedestal 12, comparing the measured temperature with the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, heater control subroutine 87 gradually controls a ramp up/down of current applied to the loop. Additionally, a built-in fail-safe mode can be included to detect process safety compliance, and can shut down operation of the heating unit if process chamber 15 is not configured properly.

Plasma control subroutine 90 comprises code for setting the low- and high-frequency RF power levels applied to the process electrodes in processing chamber 15, and for setting the low-frequency RF frequency employed. Plasma control subroutine 90 also includes program code for turning on and setting/adjusting the power levels applied to the magnetron or other microwave source used in the present invention. Plasma control subroutine 90 is invoked by chamber manager subroutine 77a, in a fashion similar to the previously described chamber component subroutines.

The above description is mainly for illustrative purposes. Other equipment such as electron cyclotron resonance (ECR) plasma CVD systems, induction-coupled RF, high-density plasma-CVD systems, or the like may be employed in depositing a passivation layer of the present invention. Additionally, variations of the above-described system, such as variations in pedestal design, heater design, RF power frequencies, and location of RF power connections, as well as other alterations, are possible. For example, the substrate could be heated by quartz lamps. It should be recognized that the present invention is not necessarily limited to use with any specific apparatus.

II. Exemplary Structures

Figure 2A:
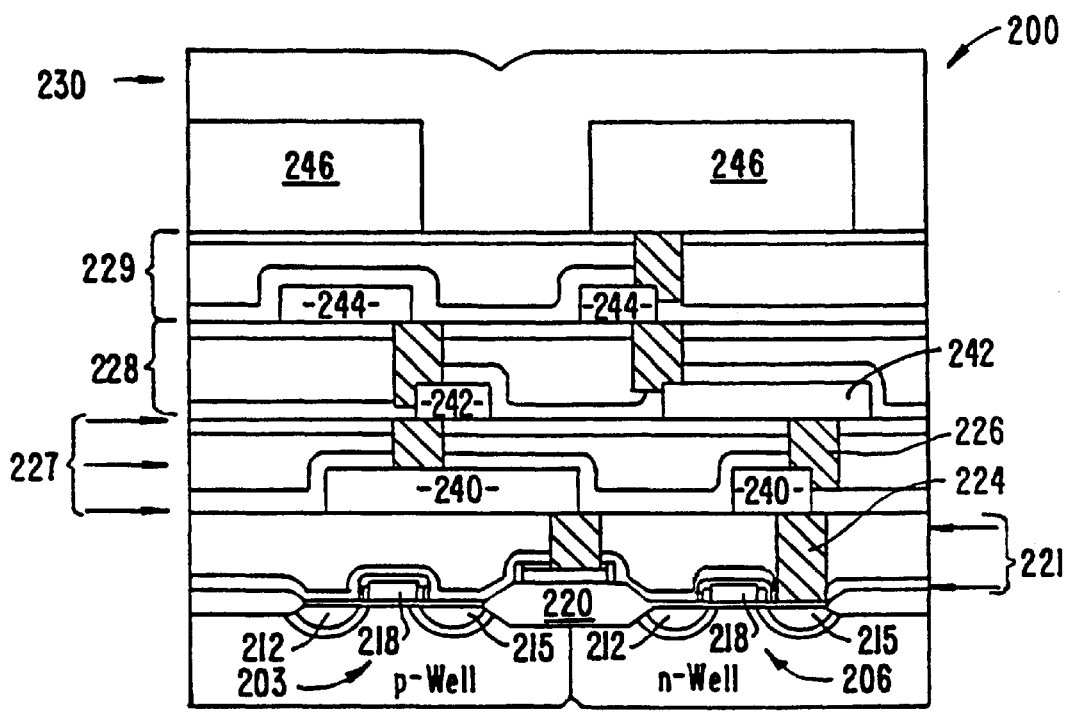
FIG. 2A is a simplified cross-sectional view of a semiconductor device manufactured in accordance with a specific embodiment of the present invention.

FIG. 2A illustrates a simplified cross-sectional view of an integrated circuit 200, which may be made in accordance with the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 is a planarized passivation layer 230.

Figure 2B:
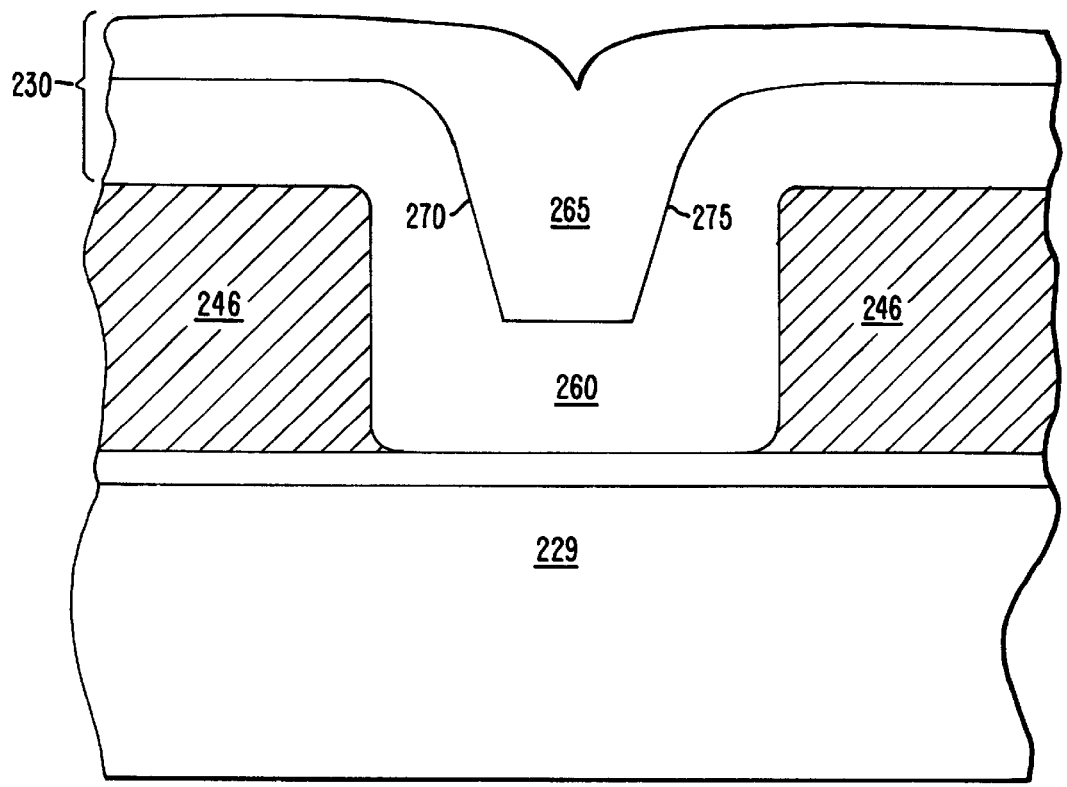
FIG. 2B is a simplified cross-sectional view of a passivation layer in accordance with a specific embodiment of the present invention that illustrates certain of the advantageous features of a planarized passivation layer of the present invention.

FIG. 2B is a detailed view of planarized passivation layer 230 deposited using the method and apparatus of the present invention. Planarized passivation layer 230 includes an FSG layer 260 and a silicon nitride layer 265. FSG layer 260 may be deposited using TEFS and TEOS, for example. The inclusion of fluorine in the process's chemistry provides good gap-fill characteristics in the deposited film. The TEFS-based process employed by the present invention deposits FSG layer 260 at a low deposition rate, on the order of less than about 4500 Å/min, and preferably between about 3000 Å/min and 4500 Å/min. Most preferably, FSG layer 260 is deposited at about 4000 Å/min.

The use of low deposition rate results in a positively sloped profile, as indicated by positive slopes 270 and 275. This is in contrast to the negatively sloped profiles that occurred in the prior art, at times sloping in to such a degree that voids were formed in the gaps being filled. Because of this positively sloped profile, the formation of voids during the deposition of FSG layer 260 is unlikely. Further, the positively sloped profile of portions of FSG layer 260 also prevents void formation during the deposition of silicon nitride layer 265. Silicon nitride layer 265 is used to improve planarization of planarized passivation layer 230, and also prevents FSG layer 260 from absorbing water, which could result in the degradation of the film's characteristics, as mentioned earlier.

Figure 2C:
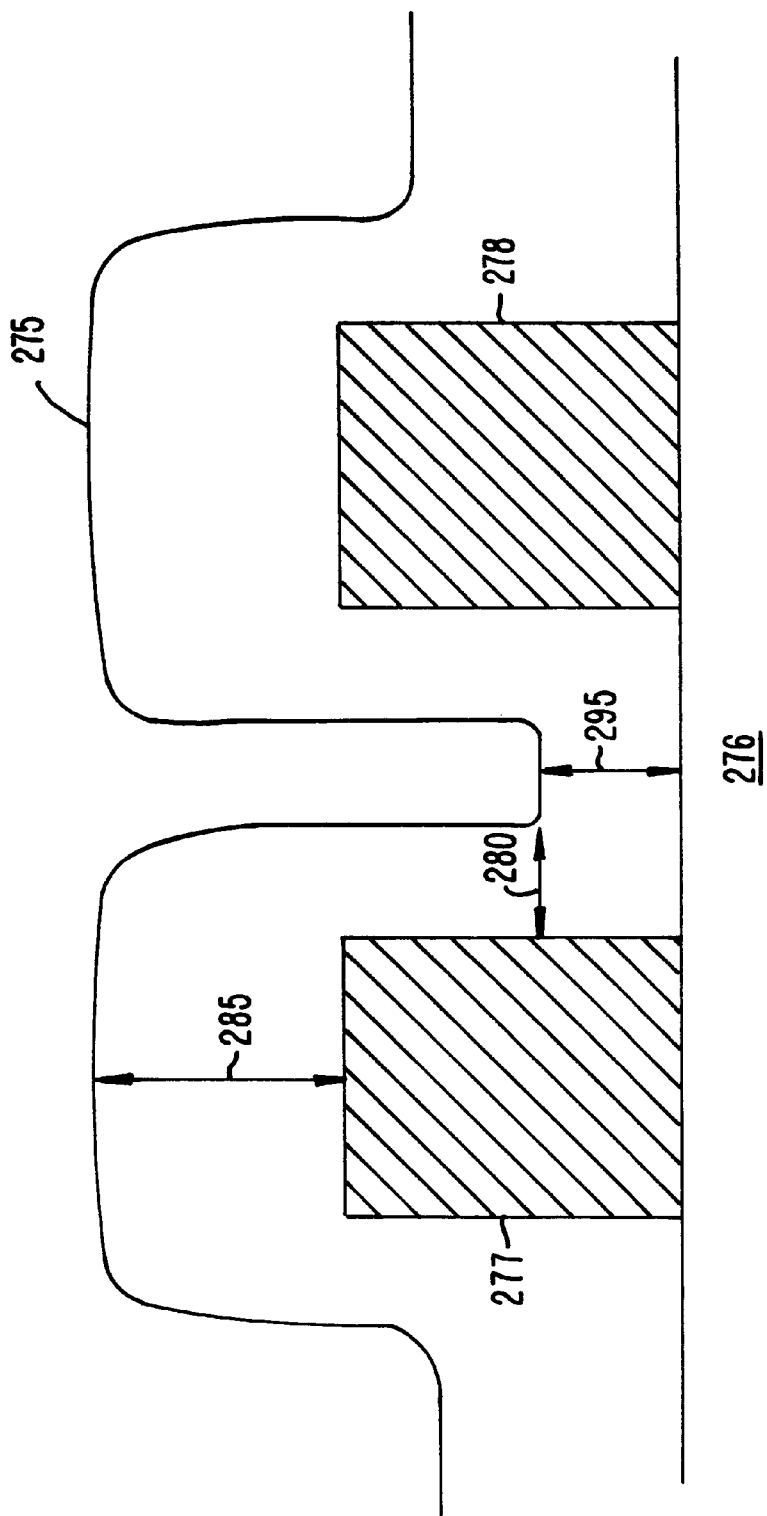
FIG. 2C is a simplified cross-sectional view of integrated circuit structures that incorporate a passivation layer in accordance with a specific embodiment of the present invention that illustrates the measurement of certain of the features of a planarized passivation layer of the present invention.

FIG. 2C illustrates the various dimensions used to calculate film coverage. A conformal film 275 is shown deposited over a substrate 276, and metal lines 277 and 278. Dimensions 280, 281, and 282 are used in arriving at sidewall step coverage and bottom step coverage for conformal film 275. Sidewall step coverage is calculated by dividing dimension 280 by dimension 281, and multiplying by 100%. Bottom step coverage is calculated by dividing dimension 282 by dimension 281, and multiplying by 100%. In the present invention, the use of low deposition rate and fluorine doping results in bottom step coverage of over 90% (a value close to 100% normally being optimal), in a specific embodiment. Sidewall step coverage in a specific embodiment is approximately 65% (again, a value close to 100% is normally optimal).

Figure 2D:
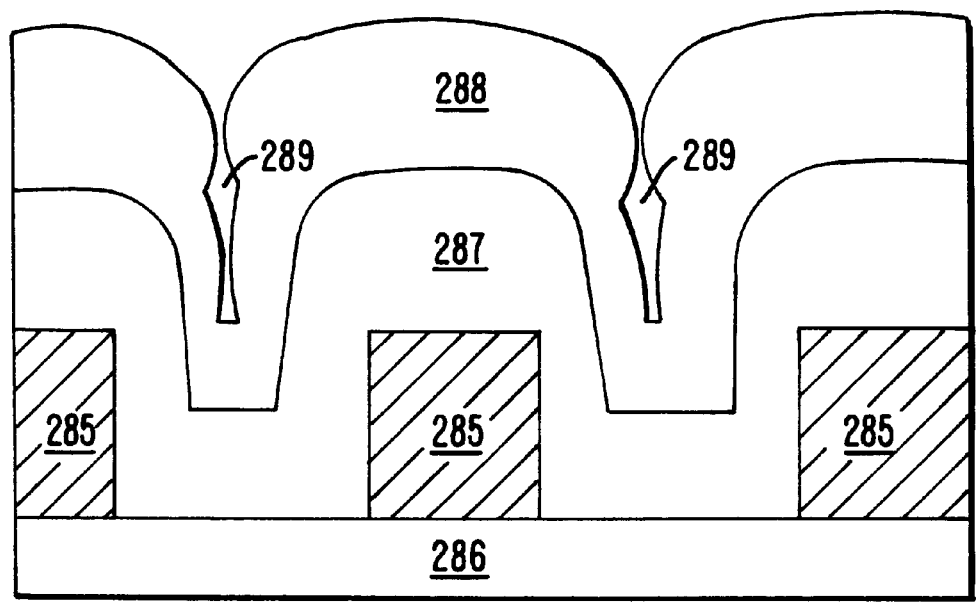
FIG. 2D is a simplified cross-sectional view of integrated circuit structures including a passivation layer illustrating the effects of a relatively high deposition rate.
Figure 2E:
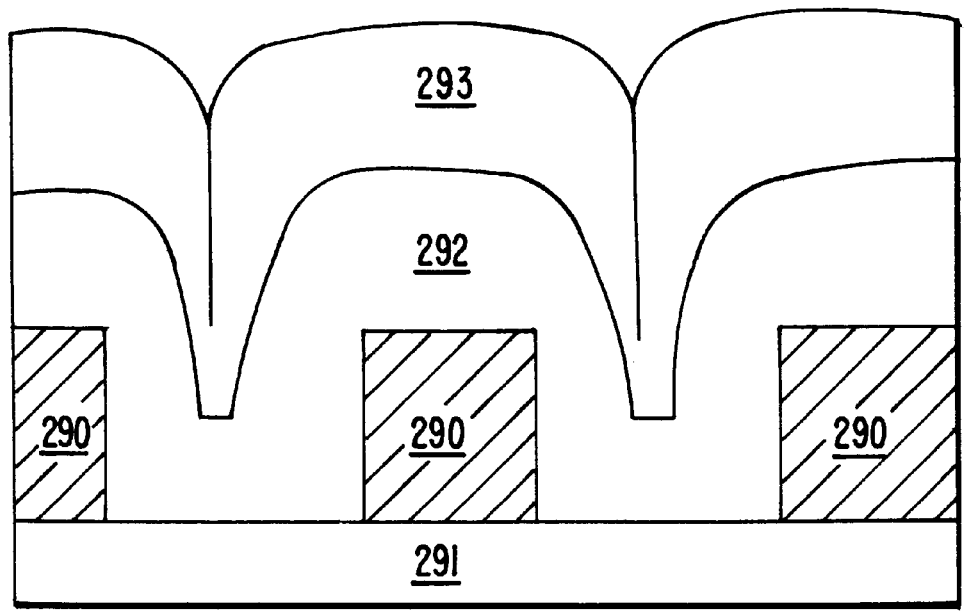
FIG. 2E is a simplified cross-sectional view of integrated circuit structures including a passivation layer in accordance with a specific embodiment of the present invention illustrating the effects of a relatively low deposition rate.

FIGS. 2D and 2E are taken from actual photomicrographs of structures fabricated experimentally, and illustrate certain of the advantages of the present invention. FIG. 2D shows metal lines 285 formed over an underlying layer 286. Metal lines 285 are normally those formed from the final metal interconnect layer deposited in the fabrication process. In FIG. 2D, an FSG layer 287 is deposited over metal lines 285 and underlying layer 286 at a deposition rate of about 6000 Å/min. This results in sidewalls of FSG layer 287 having little or no positive slope. When a nitride layer 288 is subsequently deposited, this lack of positive slope results in voids, exemplified by voids 289. Voids 289 can trap photoresist during subsequent processing steps and may result in variations in dielectric constant, among other undesirable effects.

FIG. 2E shows metal lines 290 formed over an underlying layer 291. Metal lines 285 are normally those formed from the final metal interconnect layer deposited in the fabrication process. In FIG. 2D, an FSG layer 292 according to the present invention is deposited over metal lines 290 and underlying layer 291 at a deposition rate of about 3000 Å/min. This results in sidewalls of FSG layer 292 having little or no positive slope. When a nitride layer 293 is subsequently deposited, this positive slope prevents the formation of voids, such as voids 289 in FIG. 2D, and their attendant undesirable effects. However, throughput would likely be unacceptable at a deposition rate this low.

It should be understood that simplified integrated circuit 200 of FIG. 2A and planarized passivation layer 230 of FIG. 2B are presented for illustrative purposes only. One of ordinary skill in the art could implement the present invention in relation to fabrication of other integrated circuits such as microprocessors, application-specific integrated circuits (ASICs), memory devices, and the like. Further, the present invention may be applied to fabrication of PMOS, NMOS, CMOS, bipolar, or BiCMOS devices, among others.

Figure 3:
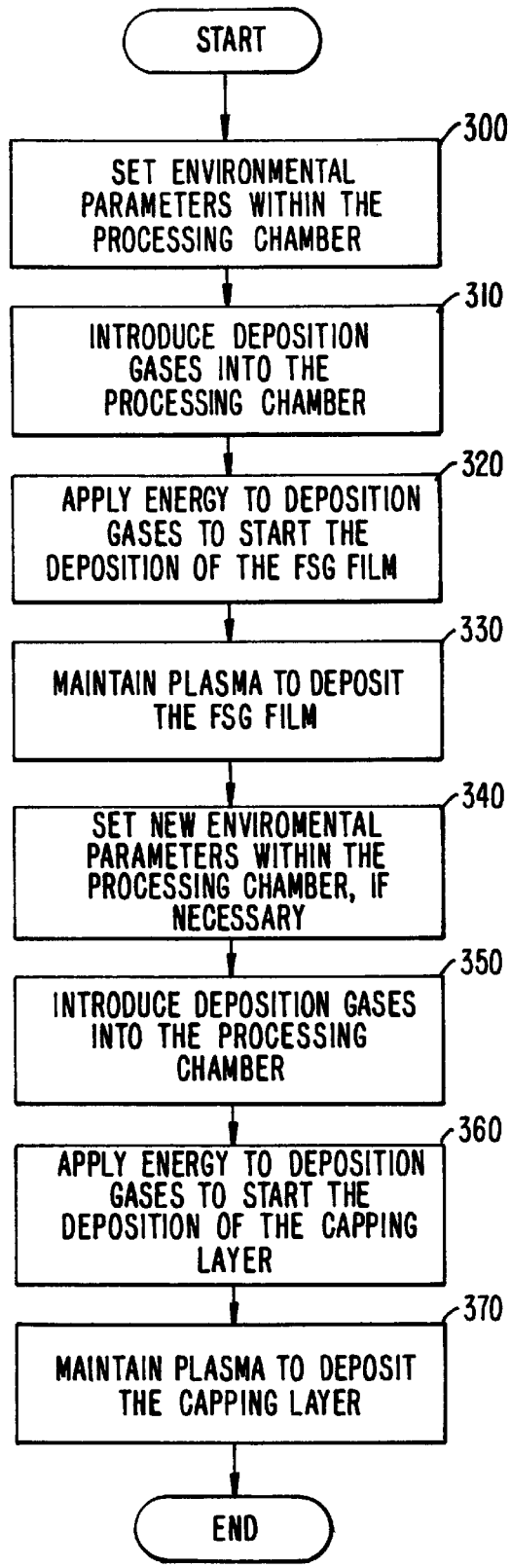
FIG. 3 is a flow diagram illustrating the steps performed in depositing a passivation layer in accordance with a specific embodiment of the present invention.

III. A Process for Depositing a Planarized Passivation Layer of the Present Invention FIG. 3 illustrates generally the method of the present invention. The flow diagram of FIG. 3 is described with reference to the detailed view of planarized passivation layer 230 of FIG. 2B and CVD system 10 of FIGS. 1A–1E. References are thus made using the elements thereof. The process is therefore described in terms of a PECVD deposition process.

The process begins by depositing FSG layer 260. At step 300, environmental parameters within the processing chamber are established. This includes stabilizing the temperature and pressure in processing chamber 15, possibly by the use of an inert gas such as helium or argon. Next, deposition gases are introduced into processing chamber 15 (step 310). These gases preferably include TEFS, helium, oxygen, and TEOS. However, other fluorine-containing gases such as ethoxysilanes (e.g., FASI-4), $CF_4$, and $C_2F_6$ may also be used, although TEFS provides better results than the other fluorine sources listed. In order to strike a plasma, RF energy is then applied to the deposition gases at step 320. At step 330, the plasma formed from the deposition gases is maintained for a period of time, depositing FSG layer 260.

As illustrated by FIG. 3, the deposition of a capping layer over FSG layer 260 (e.g., silicon nitride layer 265) begins by establishing new process parameters at step 340. Although step 340 is optional (because the parameters chosen in step 300 may be acceptable for the entire cleaning process), various chamber parameters will likely require at least small adjustments. At step 350, deposition gases are introduced into processing chamber 15. These deposition gases preferably include silane ($SiH_4$) and ammonia ($NH_3$), but may use compounds such as dichlorosilane ($SiCl_2H_2$). Next, RF energy is applied to the deposition gases in order to strike a plasma at step 360. At step 370, the plasma formed from the deposition gases is maintained for a period of time, depositing silicon nitride layer 265.

The chamber parameters used in a PECVD deposition process according to the method of the present invention may vary widely while acceptably depositing a planarized passivation layer of the present invention, but certain ranges are desirable. The TEFS-based film of the present invention may be deposited using TEFS, TEOS, oxygen, and helium (as a carrier gas). Other gases may be used in place of those listed (e.g., ozone ($O_3$) may be used in place of oxygen). TEFS is preferably introduced at a flow rate ranging between about 50 milligrams per minute (mgm) and 500 mgm, and most preferably at about 200 mgm in a specific embodiment. TEOS is preferably introduced at a flow rate ranging between about 100 mgm and 600 mgm, and most preferably at about 300 mgm in a specific embodiment. In terms of a ratio of TEOS to TEFS, the ratio may range between about 0.2:1 and 12:1, and is preferably in the range of between about 1:1 and 2:1. Most preferably, the ratio is about 1.5:1.

Oxygen is preferably introduced at a flow rate ranging between about 500 standard cubic centimeters per minute (sccm) and 3000 sccm, and most preferably at about 1180 sccm in a specific embodiment. Helium is preferably introduced at a flow rate ranging between about 200 sccm and 1500 sccm, and most preferably at about 560 sccm in a specific embodiment. The flow rates for helium are as a carrier gas for the liquid precursors TEFS and TEOS. With process chamber 15 preferably maintained at a pressure ranging from about 1 torr (T) to 50 T, and most preferably at about 5 T in a specific embodiment, a plasma may be struck and sustained in the deposition gases. RF power is applied between about 10 W and 500 W from the low-frequency RF power source, and most preferably using 80 W. RF power is applied between about 100 W and 500 W from the high-frequency RF power source, and most preferably using 250 W. Preferably, a low RF frequency of 360 kHz and a high RF frequency of 13.56 MHz are used to strike and maintain the RF plasma, although other frequencies may be preferable in other embodiments. The susceptor temperature is preferably maintained between about 300° C. and 500° C., and is most preferably about 400° C. The plasma is preferably maintained during the deposition of FSG layer 260 between about 50 seconds and 200 seconds, and is most preferably maintained for a period of about 140 seconds. These deposition times result in FSG layer 260 having a thickness of between about 5000 Å and 9000 Å. Preferably, FSG layer 260 is 7000 Å in thickness.

Silicon nitride layer 265 is then deposited. This will not normally take place in the processing chamber in which FSG layer 260 is deposited, but in a processing chamber dedicated to depositing silicon nitride layer 265 (e.g., in the multiple-chamber system shown in FIG. 1E, each layer would be deposited in a chamber dedicated to that purpose in a process of the present invention). Again, the stated flow rates, temperatures, pressures, and other chamber parameters employed are only exemplary, and values other than those given may be used with similar success. Silane is preferably introduced at a flow rate ranging between about 100 sccm and 500 sccm, and most preferably at about 300 sccm in a specific embodiment. Ammonia is preferably introduced at a flow rate ranging between about 50 sccm and 200 sccm, and most preferably at about 120 sccm in a specific embodiment. With process chamber 15 preferably maintained at a pressure ranging from about 2 T to 10 T, and most preferably at about 4.7 T in a specific embodiment, a plasma may be struck and sustained in the deposition gases. RF power is applied between about 200 W and 1500 W from the RF power source, and most preferably using 915 W. Preferably, an RF frequency of 13.56 MHz is used to strike and maintain the RF plasma, although other frequencies may be preferable in other embodiments. The susceptor temperature is preferably maintained between about 250° C. and 500° C., and is most preferably about 400° C. The plasma is preferably maintained during the deposition of silicon nitride layer 265 between about 25 seconds and 100 seconds, and is most preferably maintained for a period of about 50 seconds. These deposition times result in silicon nitride layer 265 having a thickness between about 3000 Å and 7000 Å. Preferably, silicon nitride layer 265 is 5000 Å in thickness.

The above-described gas flows, chamber pressures, and temperature ranges provide for deposition procedures that are capable of depositing a planarized passivation layer of the present invention. The parameters in the above processes should not be considered limiting to the claims, however. Other deposition gases and chamber parameters may be employed. The actual values (temperature, pressure, gas flows, etc.) selected for a particular deposition process will vary according to various applications. Also, flow values mentioned above are for DxZ chambers equipped for a 200-mm wafer and manufactured by Applied Materials, Inc., but flow values would differ depending on the type or size of chamber used. One of ordinary skill in the art may also use other chemicals, chamber parameters, and conditions for depositing a planarized passivation layer according to the present invention.

It is to be understood that the above description is intended to be illustrative and not restrictive. Many embodiments will be apparent to those of skill in the art upon reviewing the above description. By way of example, the inventions herein have been illustrated primarily with regard to a TEFS-based deposition process, but they are not so limited. Those skilled in the art will recognize other equivalent or alternative gaseous compounds and process parameters may be employed while remaining within the scope of the claims of the present invention. In addition to being used with a PECVD technique, the planarized passivation layer of the present invention may be deposited using subatmospheric CVD (SACVD), low-pressure CVD (LPCVD), or other techniques. The scope of the inventions should, therefore, be determined not with reference to the above description, but should instead be determined with reference to the appended claims, along with the full scope of equivalents to which such claims are entitled.

What is claimed is:

1. A process for depositing a multilayer film over a plurality of raised features forming gaps therebetween on a substrate disposed in a processing chamber, said process comprising:
   a) during a first deposition stage,
      i) flowing a first process gas comprising silicon, oxygen, and a halogen element into the processing chamber, and
      ii) depositing a first layer of halogen-doped silicon oxide at a deposition rate of less than about 4500 Å/min using said first process gas; and
   b) during a second deposition step subsequent to said first deposition step,
      i) flowing a second process gas comprising silicon and nitrogen into the processing chamber
      ii) depositing a second layer over said first layer using said second process gas, wherein
         said first and said second layers form a passivation layer and
         said deposition rate inhibits formation of voids in said second layer by maintaining a positive sidewall slope in said first layer in an area between or above said gaps.

2. The process of claim 1, wherein said first deposition stage and said second deposition stage are performed in separate processing chambers.

3. The process of claim 1, wherein said halogen-doped silicon oxide layer is deposited at a deposition rate of between about 3000 Å/min and 4500 Å/min.

4. The process of claim 3, wherein said halogen element is fluorine.

5. The process of claim 4, wherein said second layer is a silicon nitride layer.

6. The process of claim 1 wherein said raised features comprise a plurality of conductive lines.

7. A process for depositing a passivation layer over a plurality of raised features forming gaps therebetween on a substrate disposed in a processing chamber, said process comprising:
   a) during a first deposition stage,
      i) flowing a first process gas into the processing chamber, said first process gas comprising a first silicon-containing source, an oxygen-containing source, and a fluorine-containing source,
      ii) striking a first plasma from said first process gas,
      iii) maintaining said first plasma such that a fluorine-doped silicon oxide layer is deposited at a deposition rate of less than about 4500 Å/min, and
   b) during a second deposition stage subsequent to said first deposition stage,
      i) flowing a second process gas into the processing chamber, said second process gas comprising a second silicon-containing source gas and a nitrogen-containing source gas,
      ii) striking a second plasma from said second process gas, and
      iii) maintaining said second plasma to deposit a silicon nitride layer over said fluorine-doped silicon oxide layer, wherein
         said fluorine-doped silicon oxide layer and said silicon nitride layer form a passivation layer, and
         said deposition rate inhibits formation of voids in said silicon nitride layer by maintaining a positive sidewall slope in said fluorine-doped silicon oxide layer in an area between or above said gaps.

8. The process of claim 7, wherein said halogen-doped silicon oxide layer is deposited at a deposition rate of between about 3000 Å/min and 4500 Å/min.

9. The process of claim 7, wherein said first process gas includes triethoxyfluorosilane, tetraethoxyorthosilicate, and oxygen.

10. The process of claim 9, wherein said fluorine-doped silicon oxide layer is deposited at a temperature between about 250° C. and 450° C.

11. The process of claim 9, wherein said fluorine-doped silicon oxide layer is deposited at a pressure between about 1 torr and 50 torr.

12. The process of claim 9, wherein a ratio of said tetraethoxyorthosilicate to said triethoxyfluorosilane is between about 1:1 and 2:1.

13. The process of claim 9, wherein said oxygen is flowed into the processing chamber at a rate between about 500 sccm and 3000 sccm during said first deposition stage.

14. A process for depositing a passivation layer over a plurality of raised features forming gaps therebetween on a substrate disposed in a processing chamber, said process comprising:

depositing a first layer of said passivation layer over the substrate using a process gas comprising silicon, oxygen, and a halogen element, said first layer being deposited at a deposition rate of less than about 4500 Å/min and more than about 3000 Å/min, wherein said deposition rate inhibits formation of voids in said first layer; and depositing a second layer of said passivation layer over said first layer, wherein said second layer is exposed to and protects said first layer from an ambient environment and said deposition rate inhibits formation of voids in said second layer by maintaining a positive sidewall slope in said first layer in an area between or above said gaps.

15. The process of claim 14, wherein said second layer of said passivation layer is a silicon nitride layer.

16. The process of claim 15, wherein said first layer of said passivation layer is a fluorine-doped silicon oxide layer.

17. The process of claim 16, wherein said process gas includes triethoxyfluorosilane, tetraethoxyorthosilicate, oxygen, and helium.

18. The process of claim 17, wherein said first layer is deposited at a temperature between about 250° C. and 450° C.

19. The process of claim 17, wherein said first layer is deposited at a pressure between about 1 torr and 50 torr.

20. The process of claim 17, wherein a ratio of said tetraethoxyorthosilicate to said triethoxyfluorosilane is between about 1:1 and 2:1.

21. The process of claim 17, wherein said oxygen is flowed into the processing chamber at a rate between about 500 sccm and 3000 sccm during said depositing of said first layer.

* * * * *